US008560257B2

(12) United States Patent
Tang et al.

(10) Patent No.: US 8,560,257 B2
(45) Date of Patent: Oct. 15, 2013

(54) DYNAMIC BATTERY CAPACITY ESTIMATION

(75) Inventors: Xidong Tang, Royal Oak, MI (US);
Yandong Zhang, Plano, TX (US);
Andrew C Baughman, Northville, MI (US); Brian J. Koch, Berkley, MI (US);
Jian Lin, Beverly Hills, MI (US);
Damon R. Frisch, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 341 days.

(21) Appl. No.: 12/955,288

(22) Filed: Nov. 29, 2010

(65) Prior Publication Data

US 2012/0136594 A1    May 31, 2012

(51) Int. Cl.
*G01R 31/36* (2006.01)
*G06F 19/00* (2011.01)

(52) U.S. Cl.
USPC ................................. 702/63; 320/137; 702/65

(58) Field of Classification Search
USPC .............. 702/57, 60, 61, 63, 64, 65; 320/132, 320/137; 324/426, 427
See application file for complete search history.

(56) References Cited

U.S. PATENT DOCUMENTS

| | | | | |
|---|---|---|---|---|
| 6,832,171 | B2 * | 12/2004 | Barsoukov et al. | 702/65 |
| 7,567,085 | B2 * | 7/2009 | Kim et al. | 324/426 |
| 2007/0159137 | A1 | 7/2007 | Verbrugge et al. | |
| 2009/0091299 | A1 | 4/2009 | Lin et al. | |

OTHER PUBLICATIONS

Liaw, Jungst, Nagasubramanian, Case, Doughty, "Modeling capacity fade in lithium-ion cells", Journal of Power Sources, vol. 140, pp. 157-161, 2005.
Bhangu, Bentley, Stone, Bingham, "Nonlinear Observers for Predicting State-of-Charge and State-of-Health of Lead-Acid Batteries for Hybrid-Electric Vehicles", IEEE Transactions on Vehicular Technology, vol. 54, pp. 783-794, 2005.
Stamps, Holland, White, Gatzke, "Analysis of capacity fade in a lithium ion battery", Journal of Power Sources, vol. 150, pp. 229-239, 2005.
Ramadass, Haran, White, Popov, "Mathematical modeling of the capacity fade os Li-ion cells", Journal of Power Sources, vol. 123, pp. 230-240, 2003.
Ning, Popov, "Cycle Life Modeling of Lithium-Ion Batteries", Journal of the Electrochemical Society, vol. 151, issue 10, pp. 1584-1591, 2004.
Piller, Perrin, Jossen, "Methods for state-of-charge determination and their applications", Journal of Power Sources, vol. 116, pp. 110-117, 2003.
Verbrugge, Tate, "Adaptive state of charge algorithm for nickel metal hydride batteries including hysteresis phenomena", Journal of Power Sources, vol. 126, pp. 236-249, 2004.
Verbrugge, Frisch, Koch, "Adaptive Energy Management of Electric and Hybrid Electric Vehicles", vol. 126, pp. 236-249, 2004.
Kailath, Sayed, Hassibi, "Linear Estimation", Prentice Hall, 2000.

* cited by examiner

*Primary Examiner* — John H Le
(74) *Attorney, Agent, or Firm* — Quinn Law Group, PLLC

(57) ABSTRACT

A method of determining a state of health of a battery in real time includes estimating a parameter value associated with the state of health of the battery and determining one or more of a terminal voltage, an accumulated charge, a state of charge, and a temperature of the battery. The method further includes determining, via a computing device, a reserve capacity of the battery based at least in part on the estimated parameter value and one or more of the terminal voltage, the accumulated charge, the state of charge, and the temperature of the battery.

18 Claims, 1 Drawing Sheet

DYNAMIC BATTERY CAPACITY ESTIMATION

TECHNICAL FIELD

The disclosure relates to a dynamic battery capacity estimation procedure.

BACKGROUND

Some passenger and commercial vehicles use batteries to power electronic components. In hybrid vehicles, one or more batteries may be used to provide electrical energy to a motor that provides a torque that propels the vehicle. The operation of various control modules in the vehicle may depend upon the battery state of charge (e.g., the residual capacity of the battery relative to the reserve capacity). Further, a driver of the vehicle may wish to know how much longer the vehicle may be used before the battery must be recharged.

SUMMARY

An example method of determining a state of health of a battery in real time includes estimating a parameter value associated with the state of health of the battery and determining one or more of a terminal voltage, an accumulated charge, a state of charge, and a temperature of the battery. The method further includes determining in real time, via a computing device, a reserve capacity of the battery based at least in part on the estimated parameter value and one or more of the terminal voltage, the accumulated charge, the state of charge, and the temperature of the battery. This method may be executed by, for instance, a computing device in a vehicle.

An example vehicle includes a battery, at least one sensor, and a computing device. The sensor is configured to measure at least one of a terminal voltage, an accumulated charge, and a temperature of the battery. The computing device is configured to determine a state of charge of the battery and a parameter value associated with a state of health of the battery, as well as determine a reserve capacity of the battery in real time based at least in part on a parameter value and one or more of the terminal voltage, the accumulated charge, the state of charge, and the temperature of the battery.

DETAILED DESCRIPTION

Figure 1:
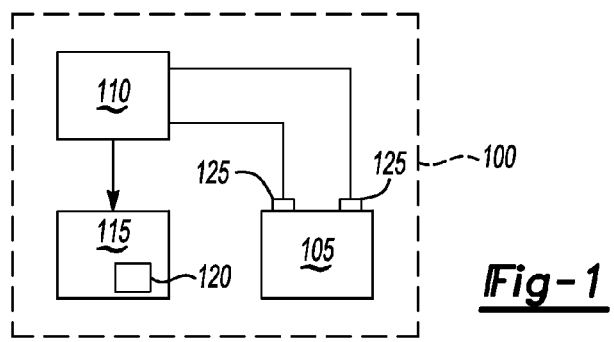
FIG. 1 is a schematic diagram of a vehicle having a computing device configured to determine a reserve capacity of a battery.

FIG. 1 illustrates a vehicle 100 having a computing device that is configured to predict reserve capacity of a battery in real time. The vehicle 100 may take many different forms and include multiple and/or alternate components and facilities. While an example vehicle 100 is shown in the Figures, the components illustrated in the Figures are not intended to be limiting. Indeed, additional or alternative components and/or implementations may be used.

As illustrated in FIG. 1, the vehicle 100 may include a battery 105, one or more sensors 110, a computing device 115, and a memory device 120. The vehicle 100 may be any passenger or commercial automobile such as a hybrid electric vehicle including a plug-in hybrid electric vehicle (PHEV) or an extended range electric vehicle (EREV), a gas-powered vehicle, a battery electric vehicle (BEV), or the like.

The battery 105 may include any device configured to store and provide electrical energy to one or more electronic components in the vehicle 100. For instance, the battery 105 may include one or more cells that convert stored chemical energy into electrical energy. The cells of the battery 105 may be charged by applying an electric current that reverses chemical reactions in the cells that would otherwise occur if the battery 105 were providing electrical energy. In one possible approach, the battery 105 may include a lithium-ion battery pack. Further, the battery 105 may include a plurality of terminals 125 to provide electrical energy to the electronic components in the vehicle 100.

As discussed in greater detail below, the battery 105 may have one or more parameter values that are associated with a state of health of the battery 105. The state of health may include a quantity representing a condition of the battery 105 relative to ideal operating conditions of the battery 105. Thus, the state of health may be used to determine the remaining lifespan of the battery 105. The parameter values may be quantities that are used to estimate or derive the state of health. Another quantity, called the state of charge, may indicate the residual (e.g., remaining) capacity of the battery 105 relative to the reserve capacity of the battery 105. Thus, the state of charge may indicate how much electrical energy may be provided before the battery 105 needs to be recharged.

The sensor 110 may include any device configured to measure a terminal voltage, an accumulated charge, or a temperature of the battery 105 and generate one or more signals representing those measured characteristics. While only one sensor 110 is illustrated, the vehicle 100 may include any number of sensors 110. For instance, one sensor may be used to measure the terminal voltage, another sensor may be used to measure the accumulated charge, and different sensor may be used to measure the temperature.

To measure the terminal voltage, the sensor 110 may include a digital or analog voltmeter configured to measure a difference in electrical potential across the terminals 125 of the battery 105. Alternatively, the sensor 110 may be configured to estimate or derive the voltage across the terminals 125 based on factors such as the current output of the battery 105, the temperature of the battery 105, and the resistance of components within the battery 105. The voltmeter may be configured to generate and output a signal representative of the electrical potential across the terminals 125 (e.g., the terminal voltage). To measure the accumulated charge, the sensor 110 may include any device configured to measure electrical current (e.g., direct current) and generate a signal representative of the magnitude of the current measured. The accumulated charge may be derived from the measured terminal current. To measure the temperature of the battery 105, the sensor 110 may include any device configured to measure a quantity of heat at one or more locations of the battery 105, including the ambient air surrounding the battery 105, and generate one or more signals that represent the highest, lowest, average, and/or median temperature measured.

The computing device 115 may include any device or devices configured to determine the reserve capacity of the battery 105 based upon a relationship between the terminal voltage, the accumulated charge, the temperature, the state of charge, and the parameter values. For instance, the computing device 115 may be configured to develop and/or access an expression that defines the voltage of the battery 105. An example expression for purposes of illustration may be as follows:

$$\Delta V(k) = \theta_1 I(k-1)\Delta t + \theta_2 V(k-1) + \theta_3 \Delta V(k-2) + \theta_4 \Delta I(k) + \theta_5 \Delta I(k-1) + \theta_6 \Delta I(k-2) \quad (1)$$

where V is the terminal voltage, I is the terminal current, k represents the present time step, $\Delta t$ is the sampling time interval, and $\Delta V(k) = V(k) - V(k-1)$, $\Delta I(k) = I(k) - I(k-1)$, and $\theta_1, \theta_2, \theta_3, \theta_4, \theta_5$, and $\theta_6$ are model parameters that may be functions of one or more of temperature, the state of charge, and the state of health of the battery 105 including reserve capacity.

The computing device 115 may be configured to estimate or derive one or more of the parameter values associated with the state of health of the battery 105, as well as determine the state of charge of the battery 105. In one possible implementation, the computing device 115 may be configured to determine the reserve capacity of the battery 105 from the parameter value, the state of charge, the terminal voltage, the accumulated charge, the temperature, or any combination of these.

For example, to determine the reserve capacity, the computing device 115 may be configured to determine a change in the open circuit voltage over time (e.g., which may be derived from a change in the terminal voltage over time) and a change in the state of charge in the battery 105 over time. The computing device 115 may be configured to identify a relationship between the change in the open circuit voltage and the change in the state of charge, or this relationship may be previously determined and stored in a look-up table in, for instance, the memory device 120. In one possible approach, the relationship between the change in the open circuit voltage and the change in the state of charge may be a ratio between those characteristics of the battery 105. The computing device 115 may access the ratio of the change in the open circuit voltage to the change in the state of charge from the look-up table and, with the parameter values, determine the reserve capacity.

The computing device 115 may be configured to recognize that the parameter values may change as the conditions of the battery 105 change. For instance, the parameter values may change as the battery 105 ages. As such, the computing device 115 may be configured to update the parameter values by setting an initial parameter value, which may be the same as the most recently used parameter value, and by applying an on-board estimation/regression procedure, such as a Recursive Least Squares procedure to the initial parameter value. An example of this is described below with respect to the process 500 illustrated in FIG. 5.

Moreover, the computing device 115 may be configured to recognize that the operating conditions of the battery 105 may affect the reserve capacity determination. Accordingly, the computing device 115 may determine a signal excitation level of the battery 105 based on any combination of the measured terminal voltage, the derived accumulated charge (e.g., from the measured terminal current), the measured temperature, the state of charge, etc., and compare the signal excitation level to a predetermined value prior to determining the reserve capacity of the battery 105. If the signal excitation level is below the predetermined value, the computing device 115 may be configured to wait for the signal excitation level to rise before determining the reserve capacity. Once the signal excitation level exceeds the predetermined value, the computing device 115 may be configured to proceed to update the parameter values and determine the reserve capacity.

Once the computing device 115 has determined the reserve capacity of the battery 105, the computing device 115 may be further configured to generate a signal representing the reserve capacity and output that signal to other components, such as control modules, in the vehicle 100.

In general, the computing device 115 may employ any of a number of computer operating systems and generally include computer-executable instructions. The computer-executable instructions may be executed by a processor used by the computing devices 115. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

The memory device 120 may include any device configured to store information in electronic form and provide the information to one or more electronic devices within the vehicle 100, including the computing device 115 and any control modules used in the vehicle 100. Like the computer-readable medium associated with the computing device 115, the memory device 120 may include any non-transitory (e.g., tangible) medium that may have non-volatile and/or volatile media. In one possible approach, the memory device 120 is included in the computer-readable medium of the computing device 115. Alternatively, the memory device 120 may be separate from the computing device 115 (e.g., embodied in another electronic device, not shown). In addition, although only one memory device 120 is shown in FIG. 1, the vehicle 100 may include any number of memory devices 120 storing some or all of the information used by the computing device 115 and other control modules in the vehicle 100.

The memory device 120 may include one or more databases with information that may be accessed by the computing device 115 or other control modules in the vehicle 100.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device (e.g., the same or a different computing device 115 illustrated in FIG. 1) employing a computer operating system such as one of those mentioned above, and are accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

In one possible approach, the database stored in the memory device 120 may include the look-up table with the relationship defining the change in the open circuit voltage relative to the change in the state of charge that may be used by the computing device 115, in addition to the parameter values, to determine the reserve capacity. Moreover, the same or a different database may include previous values measured by the sensor 110 and/or determined by the computing device 115. Therefore, the memory device 120 may further store the previous and most recent terminal voltages, accumulated charges, and temperatures measured by the sensor 110, in addition to the previous and most recent parameter values and state of charge values determined by the computing device 115.

Figure 2:
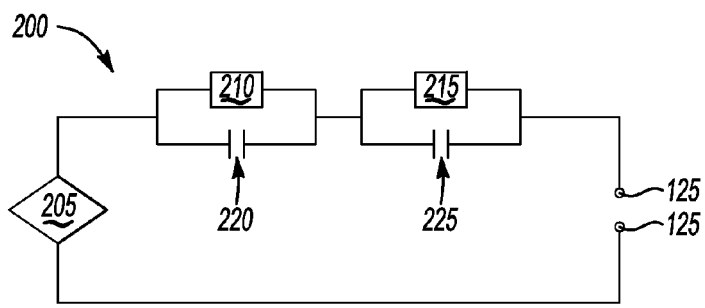
FIG. 2 illustrates a representative circuit of an example battery that may be used in the vehicle of FIG. 1.

FIG. 2 illustrates an example two-resistor-capacitor-pair (e.g., a two-RC-pair) equivalent circuit 200 of an example battery 105 that may be used in the vehicle 100 of FIG. 1. The two-RC-pair circuit 200 of FIG. 2 is merely an example to illustrate the implementation of the real time determination of the reserve capacity described herein. Other circuit models that characterize the dynamic behavior of the battery 105 in terms of the terminal current as the input and the terminal voltage as the output may be used to determine the reserve capacity.

For purposes of illustration, the circuit 200 includes a voltage source 205, first and second resistive elements 210, 215, and first and second capacitive elements 220, 225. The circuit 200 may have any number of voltage sources, resistive elements, and capacitive elements to model the battery 105. The voltage source 205 represents an open circuit (e.g., no load) voltage across the terminals 125 of the battery 105. Each of the resistive elements 210, 215 is disposed in parallel with one of the capacitive elements, 220, 225, presenting two RC pairs in the circuit 200 of FIG. 2. The voltage across one of the RC pairs (e.g., the first resistive element 210 and the first capacitive element 220) may represent a double layer voltage of the battery 105, while the voltage across the other of the RC pairs (e.g., the second resistive element 215 and the second capacitive element 225) may represent a diffusion voltage of the battery 105.

The terminal voltage of the circuit 200 may be expressed as $$V(k) = V_{oc}(k) = I(k)R(k) + V_{dl}(k) + V_{diff}(k) \quad (2)$$

where V is the measured terminal voltage, I is the measured terminal current, $V_{oc}$ is the open-circuit voltage, R is the Ohmic resistance, and $V_{dl}$ and $V_{diff}$ (e.g., the voltages across the two RC pairs) are the double layer voltage and the diffusion voltage, respectively. The double layer voltage ($V_{dl}$) may be dynamically described by Equation 3 and the diffusion voltage ($V_{diff}$) may be dynamically described by Equation 4, below:

$$V_{dl}(k) = \exp\left(-\frac{\Delta t}{R_{dl}C_{dl}}\right)V_{dl}(k-1) + R_{dl}\left(1 - \exp\left(-\frac{\Delta t}{R_{dl}C_{dl}}\right)\right)I(k-1) \quad (3)$$

$$V_{diff}(k) = \exp\left(-\frac{\Delta t}{R_{diff}C_{diff}}\right)V_{diff}(k-1) + R_{diff}\left(1 - \exp\left(-\frac{\Delta t}{R_{diff}C_{diff}}\right)\right)I(k-1). \quad (4)$$

Equations (2), (3), and (4) may be combined to describe the equivalent circuit 200 using a second-order differential equation.

The equivalent circuit 200 illustrated in FIG. 2 may be further used to establish a relationship between the reserve capacity of the battery 105 and the parameters in the model of Equation (1). That is, if Q represents the reserve capacity, the change in the state of charge (ΔSOC) may be expressed as follows:

$$\Delta SOC = \Delta s / Q \quad (5)$$

where Δs represents the change in coulombs in terms of Ampere-hours (AH) charged into the battery 105 or discharged from the battery 105. From this, the reserve capacity (Q) can be expressed as:

$$Q = \frac{\Delta s}{\Delta V_{oc}} \times \frac{\Delta V_{oc}}{\Delta SOC}. \quad (6)$$

The value of $\Delta V_{oc}/\Delta SOC$ may define the slope of the open circuit voltage versus the state of charge and may be stored in the look-up table in the memory device 120. Since the voltage expression of Equation (1) and the reserve capacity expression of Equation (6) are of the same battery 105, Equations (2), (3), (4), and (6) can be combined to define a relationship between the reserve capacity, the terminal voltage, the accumulated charge (IΔt), the state of charge, and the model parameters of Equation (1) as presented in Equation (7), below:

$$Q = \frac{I\Delta t}{\Delta V_{oc}} \times \frac{\Delta V_{oc}}{\Delta SOC} = \frac{1 - \theta_2 - \theta_3}{\theta_1} \times \frac{\Delta V_{oc}}{\Delta SOC}. \quad (7)$$

Accordingly, the computing device 115 may be configured to solve for the reserve capacity (Q) of any battery 105 in real time using, for instance, an equation similar to Equation (7).

Figure 3:
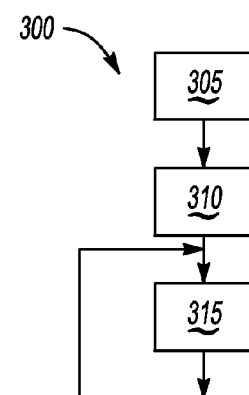
FIG. 3 illustrates an example flowchart of a process that may be used by the computing device of FIG. 1 to generate a signal representing the reserve capacity of the battery.

FIG. 3 illustrates an example flowchart of a process 300 that may be used by the computing device 115 of FIG. 1 to generate a signal representing the reserve capacity (Q) of the battery 105.

At block 305, the computing device 115 may estimate the parameter value. As described above, the parameter value may be associated with the state of health of the battery 105. In the equations above, and in particular Equation (7), $\theta_1$, $\theta_2$, and $\theta_3$ may represent the parameter values estimated by the computing device 115. In one example approach, the computing device 115 may access the previously used parameter values from the memory device 120, and continue to use the same parameter value until the computing device 115 determines otherwise, such as at block 330 described below.

At block 310, the computing device 115 may read the previous reserve capacity of the battery 105. That is, the way the computing device 115 determines the present reserve capacity may depend upon the previous reserve capacity, which may be stored in the memory device 120. Therefore, the computing device 115 may read the previous reserve capacity by accessing the previous reserve capacity from the memory device 120.

At block 315, the computing device 115 may determine the terminal voltage, the accumulated charge (e.g., which may be derived from the terminal voltage), and the temperature of the battery 105. For instance, one or more sensors 110 may measure the terminal voltage, the terminal current, and/or the temperature as described above with respect to FIG. 1. Each of the sensors 110 may output one or more signals representing the measured voltage, current, and/or temperature. The computing device 115 may determine the terminal voltage, the accumulated charge, and the temperature from the signals from the sensor 110.

At block 320, the computing device 115 may determine the state of charge of the battery 105. As described above, the state of charge is defined by a ratio of the residual capacity to the reserve capacity. As such, the computing device 115 may be configured to receive or determine the residual capacity. With the residual capacity and the reserve capacity read at block 310, the computing device 115 may determine the state of charge. The state of charge can also be determined through the open circuit voltage or using other procedures.

At block 325, the computing device 115 may determine a signal excitation level of the battery 105 based on, for example, any combination of the terminal voltage, the accumulated charge, the state of charge, and the temperature of the battery 105. The computing device 115 may be configured to consider other factors as well when determining the signal excitation level. The signal excitation level may provide an indication that the battery 105 is operating as expected by the computing device 115.

At decision block 330, the computing device 115 may compare the signal excitation level determined at block 325 to a predetermined threshold. The computing device 115 may be configured to recognize that the reserve capacity may be best determined when the signal excitation level exceeds the predetermined threshold. If the signal excitation level meets or exceeds the predetermined threshold, the process 300 may continue at block 335. If the signal excitation level does not meet or exceed the predetermined threshold, the process 300 may return to block 315 so that the computing device 115 may continue to receive the measured terminal voltage, terminal current, and temperature until the signal excitation level exceeds the predetermined threshold.

Figure 5:
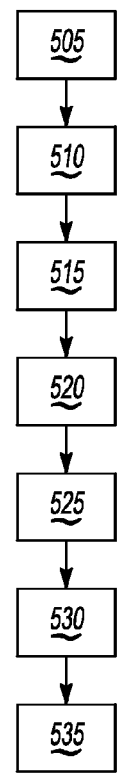
FIG. 5 illustrates an example flowchart of a process that may be used by the computing device during the process illustrated in FIG. 3 to update a parameter value.

At block 335, the computing device 115 may update the parameter values to, for instance, reflect changes in the battery 105 since the parameter values were previously estimated. FIG. 5, below, illustrates one example process 500 the computing device 115 may use to update the parameter values. The computing device 115 may store the updated parameter value in the memory device 120 and use the updated parameter values in place of the parameter values estimated at block 305.

Figure 4:
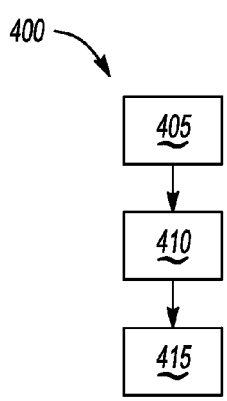
FIG. 4 illustrates an example flowchart of a process that may be used by the computing device during the process illustrated in FIG. 3 to determine the reserve capacity.

At block 340, the computing device 115 may determine the reserve capacity based on factors such as the estimated parameter value, which may be the updated parameter value from block 335, the terminal voltage, the accumulated charge, and the temperature of the battery 105 received at block 315, and the state of charge determined at block 320. Moreover, the computing device 115 may consider, as presented in Equation (7) discussed above, the ratio of the change in the terminal voltage ($\Delta V_{oc}$) to the change in the state of charge ($\Delta SOC$) when determining the reserve capacity. FIG. 4, below, illustrates one example process 400 that the computing device 115 may use to determine the reserve capacity.

At block 345, the computing device 115 may generate one or more signals representing the reserve capacity of the battery 105 as determined at block 340. The signal may be transmitted to the memory device 120 so that the reserve capacity may be stored and accessed at block 330 during a subsequent iteration of the process 300. Moreover, the signal may be transmitted to other control modules in the vehicle 100 so that the other control modules may determine the state of charge of the battery 105. Alternatively, the computing device 115 may determine the state of charge based on the reserve capacity determined at block 340 and generate a signal representing the state of charge that may be transmitted to the other control modules in the vehicle 100. Accordingly, the computing device 115 or one of the control modules may determine the remaining life of the battery 105 based at least in part on the reserve capacity At decision block 350, the computing device 115 may determine whether to execute another iteration of one or more elements of the process 300. For instance, the computing device 115 may execute multiple iterations of the process 300 to determine the open circuit voltage ($V_{oc}$) and the state of charge (SOC) at multiple time steps (k) so that the computing device 115 can determine the change in the open circuit voltage ($\Delta V_{oc}$) and the change in the state of charge ($\Delta SOC$) when determining the reserve capacity. If the computing device 115 elects to execute another iteration of the process 300, the process 300 may continue at block 315. If not, the process 300 may continue at block 355.

At block 355, the computing device 115 may store one or more of the values from any of the iterations of the process 300 in the memory device 120. For instance, the computing device 115 may store the estimated parameter value or the updated parameter value as the most recent parameter value in the memory device 120 so that the most recent parameter value may be used at block 305 during the next iteration of the process 300. The computing device 115 may store other values such as the terminal voltage, the accumulated charge, the measured terminal current, the temperature, the state of charge, etc. in the memory device 120 as well.

FIG. 4 illustrates an example flowchart of a process 400 that may be used by the computing device 115 during the process 300 illustrated in FIG. 3 to determine the reserve capacity.

At block 405, the computing device 115 may determine the change in the terminal voltage over time. The computing device 115 may, for instance, store the terminal voltage determined at block 315 during each iteration of the process 300 illustrated in FIG. 3 in the memory device 120. Moreover, the computing device 115 may determine the change in the terminal voltage based on a difference between the earliest terminal voltage and the most recent terminal voltage stored in the memory device 120.

At block 410, the computing device 115 may determine the change in the state of charge of the battery 105 over time. The computing device 115 may, for instance, store the state of charge determined at block 320 during each iteration of the process 300 illustrated in FIG. 3 in the memory device 120. Moreover, the computing device 115 may determine the change in the state of charge based on a difference between the earliest state of charge and the most recent state of charge stored in the memory device 120.

At block 415, the computing device 115 may determine the reserve capacity based at least in part on the change in the open circuit voltage, the change in the state of charge, and the parameter value. For instance, the computing device 115 may determine the reserve capacity by identifying a relationship between the change in the open circuit voltage, the change in the state of charge, and the parameter value for the battery 105. In one possible approach, the computing device 115 may use an equation similar to Equation (7) above to solve for the reserve capacity based on the change in the open circuit voltage ($\Delta V_{oc}$), the change in the state of charge ($\Delta SOC$), and one or more parameter values (e.g., $\theta_1$, $\theta_2$, $\theta_3$, within the context of Equation (7)).

As discussed above, the computing device 115 may be configured to solve for the reserve capacity by accessing information from, for instance, one or more look-up tables stored in the memory device 120. In one possible implementation, the value of $\Delta V_{oc}/\Delta SOC$ as presented in Equation (7) may define the slope of the open circuit voltage versus the state of charge and may be stored in the look-up table in the memory device 120. Therefore, instead of calculating this ratio, the computing device 115 may access the ratio from the look-up table and solve for the reserve capacity based on the accessed ratio.

FIG. 5 illustrates an example flowchart of a process 500 that may be used by the computing device 115 during the process illustrated in FIG. 3 to update a parameter value by applying, for instance, a Recursive Least Squares procedure to the parameter value.

At block 505, the computing device 115 may set an initial parameter value for each parameter of the battery 105. For instance, the initial parameter values may be the same as the estimated parameter values from block 305 of process 300 illustrated in FIG. 3.

At block 510, the computing device 115 may generate a parameter vector that includes the initial parameter values from block 505. Within the context of Equation (1), which has six parameter values (e.g., $\theta_1$, $\theta_2$, $\theta_3$, $\theta_4$, $\theta_5$, and $\theta_6$), the parameter vector may include a 1×6 matrix.

At block 515, the computing device 115 may generate a covariance matrix, P.
The covariance matrix may be a positive definite matrix defined as $$P(0)=\mu I_{6\times 6} \qquad (8)$$

where $I_{6\times 6}$ is a 6×6 identity matrix and $\mu$ is a positive number. The size of the covariance matrix may depend upon the number of parameter values in the parameter vector generated at block 510. That is, since the parameter vector generated at block 510 includes six parameters in a 1×6 vector matrix, the covariance matrix is a 6×6 identity matrix. If, however, the parameter vector had five or seven parameters, the covariance matrix may be a 5×5 identity matrix or a 7×7 identity matrix, respectively.

At block 520, the computing device 115 may receive the terminal voltage and terminal current measured by the sensor 110 at multiple time steps (e.g., the variable k in Equation (1), above), and derive the accumulated current from the measured terminal current. During the iterations of the process 300 illustrated in FIG. 3, the computing device 115 may store the terminal voltage, terminal current, and/or accumulated charge for each iteration. In this example approach, each iteration of the process 300 may constitute one time step (e.g., (k), (k−1), (k−2), etc.).

At block 525, the computing device 115 may generate a signal vector that includes one or more of the measured terminal voltage and the measured terminal current for each time step as received by the computing device 115 at block 520.

At block 530, the computing device 115 may multiply the covariance matrix generated at block 515 with the signal vector generated at block 525 to define a Kalman gain, which may be used to more accurately estimate the parameter values given the terminal voltage and terminal current at each time step as determined at block 520.

At block 535, the computing device 115 may update the parameter values in light of the Kalman gain determined at block 530. The updated parameter values may be used at block 340 of FIG. 3 to determine the reserve capacity of the battery 105.

While the best modes for carrying out the invention have been described in detail, those familiar with the art to which this invention relates will recognize various alternative designs and embodiments for practicing the invention within the scope of the appended claims.

The invention claimed is:

1. A method of determining a state of health of a battery in real time, the method comprising:
    estimating a parameter value associated with the state of health of the battery;
    determining one or more of a terminal voltage, an accumulated charge, a state of charge, and a temperature of the battery;
    determining in real time, via a computing device, a reserve capacity of the battery based at least in part on the estimated parameter value and one or more of the terminal voltage, the accumulated charge, the state of charge, and the temperature of the battery; and
    determining a signal excitation level based on one or more of the terminal voltage, the terminal current, the state of charge, and the temperature of the battery;
    comparing the signal excitation level to a predetermined threshold; and
    updating the parameter value if the signal excitation level is above the predetermined threshold.

2. A method as set forth in claim 1, wherein determining the reserve capacity includes:
    determining a change in an open circuit voltage over time, wherein the open circuit voltage is derived from the terminal voltage;
    determining a change in a state of charge of the battery over time; and
    determining the reserve capacity based at least in part on the change in the open circuit voltage, the change in the state of charge, and the parameter value.

3. A method as set forth in claim 2, wherein determining the reserve capacity includes identifying a relationship between the change in the open circuit voltage and the change in the state of charge of the battery.

4. A method as set forth in claim 3, wherein identifying the relationship includes accessing a ratio representing the relationship from a look-up table.

5. A method as set forth in claim 1, further comprising storing at least one of the estimated parameter value and the updated parameter value in a memory device.

6. A method as set forth in claim 1, wherein updating the parameter value includes:
    setting an initial parameter value; and
    applying, via the computing device, a Recursive Least Squares procedure to the initial parameter value.

7. A method as set forth in claim 6, wherein applying the Recursive Least Squares procedure includes generating a parameter vector that includes an initial parameter value for a plurality of parameters.

8. A method as set forth in claim 7, wherein applying the Recursive Least Squares procedure includes generating a covariance matrix, wherein the covariance matrix includes a positive definite matrix.

9. A method as set forth in claim 8, wherein applying the Recursive Least Squares procedure includes:

measuring one or more of the terminal voltage and a terminal current at a plurality of time steps, wherein the accumulated charge is derived from the terminal current; and generating a signal vector that includes one or more of the measured terminal voltage and the measured terminal current for each time step.

10. A method as set forth in claim 9, wherein applying the Recursive Least Squares procedure includes multiplying, via the computing device, the covariance matrix with the signal vector to define a Kalman gain.

11. A method as set forth in claim 10, wherein applying the Recursive Least Squares procedure includes updating the parameter values in the parameter vector based at least in part upon the Kalman gain.

12. A method as set forth in claim 1, further comprising generating, via the computing device, a signal representing the reserve capacity of the battery.

13. A method as set forth in claim 12, further comprising determining a battery life based at least in part on the battery capacity.

14. A vehicle comprising:
a battery;
at least one sensor configured to measure at least one of a terminal voltage, a terminal current, and a temperature of the battery;
a computing device in communication with the at least one sensor and configured to determine an accumulated charge, a state of charge of the battery, and a parameter value associated with a state of health of the battery;
wherein the computing device is further configured to determine a reserve capacity of the battery in real time based at least in part on a parameter value and one or more of the terminal voltage, the accumulated charge, the state of charge, and the temperature of the battery; and
wherein the computing device is configured to determine a signal excitation level based on one or more of the measured terminal voltage, the measured terminal current, the determined state of charge, and the measured temperature of the battery, and wherein the computing device is further configured to compare the signal excitation level to a predetermined threshold and update the parameter value if the signal excitation level is above the predetermined threshold.

15. A vehicle as set forth in claim 14, wherein the computing device is configured to determine a change in the open circuit voltage over time from the terminal voltage, determine a change in the state of charge of the battery over time, and determine the reserve capacity based at least in part on the change in the open circuit voltage, the change in the state of charge, and the parameter value.

16. A vehicle as set forth in claim 14, wherein the computing device is configured to estimate the parameter value by setting an initial parameter value and applying a Recursive Least Squares procedure to the initial parameter value.

17. A vehicle as set forth in claim 14, wherein the computing device is configured to generate a signal representing the reserve capacity.

18. A non-transitory computer-readable medium tangibly embodying computer-executable instructions comprising:
estimating a parameter value associated with the state of health of the battery;
determining one or more of a terminal voltage, an accumulated charge, a state of charge, and a temperature of the battery;
determining, via a computing device, a reserve capacity of the battery based at least in part on the estimated parameter value and one or more of the terminal voltage, the accumulated charge, the state of charge, and the temperature of the battery; and
determining a signal excitation level based on one or more of the terminal voltage, the terminal current, the state of charge, and the temperature of the battery;
comparing the signal excitation level to a predetermined threshold; and
updating the parameter value if the signal excitation level is above the predetermined threshold.

\* \* \* \* \*